US012712284B2

(12) United States Patent
Timmins et al.

(10) Patent No.: US 12,712,284 B2
(45) Date of Patent: Aug. 18, 2026

(54) MODULAR HEAT MITIGATION SYSTEM WITH mmWave SUPPRESSION FOR ACTIVE ELECTRONICALLY STEERED ANTENNAS

(71) Applicant: JABIL INC., St. Petersburg, FL (US)

(72) Inventors: Ian Jeffery Timmins, St. Petersburg, FL (US); Babak Zarrin Rafie, St. Petersburg, FL (US)

(73) Assignee: Jabil, Inc., St. Petersburg, FL (US)

( * ) Notice: Subject to any disclaimer, the term of this patent is extended or adjusted under 35 U.S.C. 154(b) by 39 days.

(21) Appl. No.: 18/694,801

(22) PCT Filed: Sep. 16, 2022

(86) PCT No.: PCT/US2022/076550
§ 371 (c)(1),
(2) Date: Mar. 22, 2024

(87) PCT Pub. No.: WO2023/049664
PCT Pub. Date: Mar. 30, 2023

(65) Prior Publication Data

US 2024/0405448 A1 Dec. 5, 2024

Related U.S. Application Data

(60) Provisional application No. 63/261,488, filed on Sep. 22, 2021.

(51) Int. Cl.
*H01Q 21/06* (2006.01)
*H01Q 1/02* (2006.01)
(Continued)

(52) U.S. Cl.
CPC ............. *H01Q 21/065* (2013.01); *H01Q 1/02* (2013.01); *H05K 1/0298* (2013.01); *H05K 1/165* (2013.01); *H05K 2201/10098* (2013.01)

(58) Field of Classification Search
CPC ...... H01Q 21/065; H01Q 1/02; H01Q 21/064; H01Q 21/0093; H05K 1/0298;
(Continued)

(56) References Cited

U.S. PATENT DOCUMENTS 10,637,159 B2 * 4/2020 Yoon ........................ H01Q 1/02
2009/0315759 A1 12/2009 Mak et al.
(Continued)

FOREIGN PATENT DOCUMENTS

CN 110994116 A 4/2020

OTHER PUBLICATIONS

Maxim Intergated: "Ball Grid Array (Bga) Package Application Notes", Dec. 31, 2014 (Dec. 31, 2014), pp. 1-5, XP093398350, Retrieved from the Internet: URL: https://www.analog.com/media/en.technical-documentation/app-notes/ball-grid-array-bga-packages-and-pcb-design-guidelines.pdf.
(Continued)

*Primary Examiner* — Seung H Lee
(74) *Attorney, Agent, or Firm* — Shumaker, Loop & Kendrick, LLP; John A. Miller

(57) ABSTRACT

A mmWave phased array antenna that has particular application to be used in a 5G radio. The antenna includes an enclosure and a RGB structure provided in the enclosure, where the RGB structure includes a plurality of layers having dielectric layers and conductive layers. The antenna also includes a plurality of radiating elements formed on one side of the RGB structure and a plurality of beamforming ICs formed on an opposite side of the RGB structure from the radiating elements, where gaps are defined between the beamforming ICs. A modular heatsink unit is removably coupled to the enclosure, and includes a heatsink, a plurality of pedestals thermally coupled thereto, where each pedestal is thermally coupled to one of the beamforming ICs, and a
(Continued)

plurality of propagation suppressing elements, where a separate propagation suppressing element is provided in each gap between the beamforming ICs.

19 Claims, 3 Drawing Sheets

(51) Int. Cl.
*H05K 1/02* (2006.01)
*H05K 1/16* (2006.01)

(58) Field of Classification Search
CPC .......... H05K 1/165; H05K 2201/10098; H01L 2223/6677; H01L 23/66; H01L 23/36
See application file for complete search history.

(56) References Cited

U.S. PATENT DOCUMENTS

| | | | | |
|---|---|---|---|---|
| 2019/0013580 | A1* | 1/2019 | Vigano | H01Q 3/2658 |
| 2019/0230800 | A1 | 7/2019 | Neuman et al. | |
| 2019/0267722 | A1 | 8/2019 | Yoon et al. | |
| 2021/0075122 | A1 | 3/2021 | Thai et al. | |

OTHER PUBLICATIONS

Ti: "Plastic Ball Grid Array (PBGA)", Application Report, Aug. 31, 2015 (Aug. 31, 2015), pp. 1-23, XP093398346, Retrieved from the Internet: URL: https://www.ti.com/lit/an/ssza002b/ssza002b.pdf?ts-1778805232711.

* cited by examiner

MODULAR HEAT MITIGATION SYSTEM WITH mmWave SUPPRESSION FOR ACTIVE ELECTRONICALLY STEERED ANTENNAS

BACKGROUND

Field

This disclosure relates generally to a millimeter wave (mmWave) antenna and, more particularly, to a mmWave phased array antenna including a modular heatsink insert coupled to a plurality of beamforming integrated circuits (ICs), where the insert can be used in other mmWave phased array antennas operating at other frequency bands.

Discussion of the Related Art

Cellular telecommunications companies began deploying fifth generation (5G) radio technology standard for cellular networks in 2019. The 5G radio standard utilizes a higher frequency spectrum than previous generations of commercial communications technologies. MmW phased array antennas are being designed and developed for the 5G protocol that provides increased performance over 4G systems while also reducing costs. 5G mmWave antennas typically require precise manufacturing of printed circuit boards (PCBs) because antenna features on the order of a wavelength are at the limits of manufacturing tolerance of the PCB fabrication process. There are number of frequency bands that are used for 5G radios, such as K-band, 24.25-27.50 GHz, V-band, 39.50-43.50 GHZ, and Ka-band, 37.00-40.00 GHz. The antenna radiating elements in the phased array antenna need to be spaced one-half wavelength apart to operate properly, which requires different configurations of the components in the antenna including the spacing of beamforming ICs.

The design of 5G mmWave phased array antennas is challenged by high heat generation from a large number of application specific integrated circuits (ASICs), such as the beamforming ICs, that must be dissipated in order to maintain proper functionality. This can be problematic from a design and tooling perspective because, as mentioned above, the size of the phased array antenna and the ASIC spacing changes depending on the operating frequency band of interest. In other words, the spacing of the heatsinks that are coupled to the ASICs changes with the frequency band of interest which requires different heatsink designs.

SUMMARY

The following discussion discloses and describes a mmWave phased array antenna that has particular application to be used in a 5G radio. The antenna includes an enclosure and a PCB structure provided in the enclosure, where the PCB structure includes a plurality of layers having dielectric layers and conductive layers. The antenna also includes a plurality of radiating antenna elements formed on one side of the PCB structure and a plurality of beamforming ICs formed on an opposite side of the PCB structure from the radiating antenna elements, where gaps are defined between the beamforming ICs. A modular heatsink unit is removably coupled to the enclosure, and includes a heatsink, a plurality of pedestals thermally coupled thereto, where each pedestal is thermally coupled to one of the beamforming ICs, and a plurality of propagation suppressing elements, where a separate propagation suppressing element is provided in each gap between the beamforming ICs.

Additional features of the disclosure will become apparent from the following description and appended claims, taken in conjunction with the accompanying drawings.

DETAILED DESCRIPTION

The following discussion of the embodiments of the disclosure directed to a mmWave phased array antenna including a modular heatsink insert coupled to a plurality of beamforming ICs is merely exemplary in nature, and is in no way intended to limit the disclosure or its applications or uses. For example, the discussion herein refers to the antenna as being part of a phased array antenna for a 5G radio. However, as will be appreciated by those skilled in the art, the antenna will have other applications.

Figure 1:
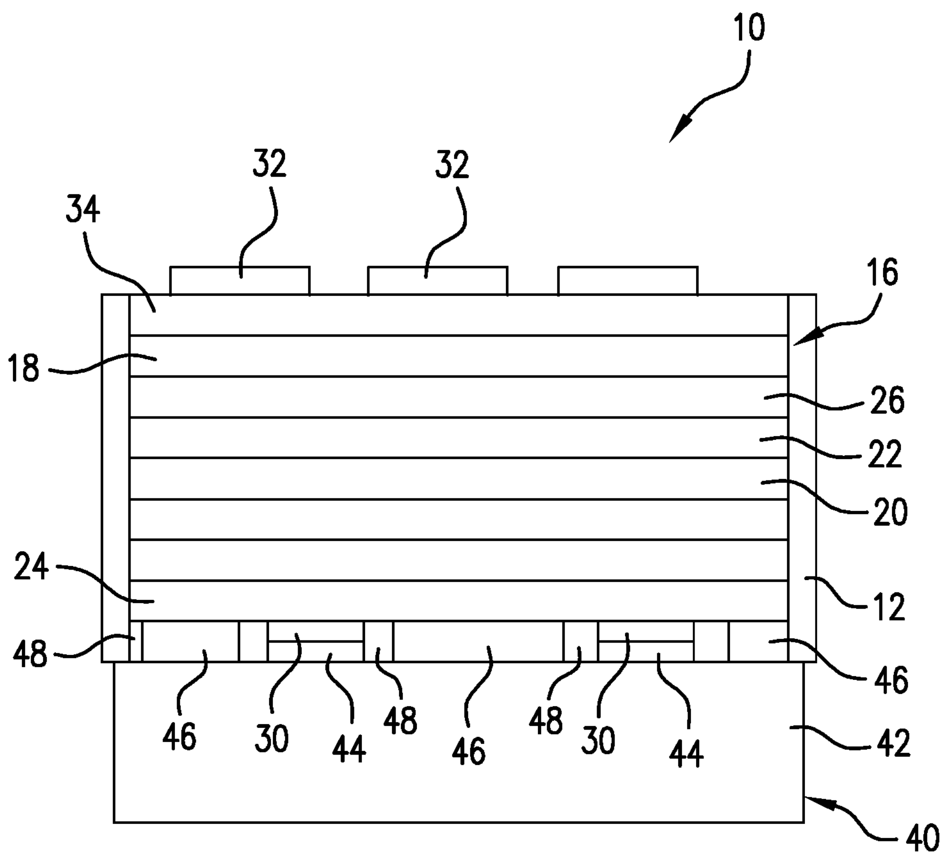
FIG. 1 is a profile view of a mmWave phased array antenna including an array of patch antenna radiating elements and a modular heatsink insert coupled to beamforming ICs.

FIG. 1 is a profile view a mmWave phased array antenna 10, where the antenna 10 can be part of a 5G radio. The antenna 10 includes an outer enclosure 12 that encloses a PCB structure 16 having a stack of layers 18 including core dielectric layers 20, dielectric insulating prepreg layers 22, copper layers 24 and a feed layer 26, where the number, thickness, configuration, material, etc. of the layers 18 would be designed for a particular antenna as would be well understood by those skilled in the art. A number of beamforming ICs 30 are provided at one side of the PCB structure 16 and each includes the circuitry necessary for beam phase combining and beam steering for multiple radiating elements in the phased array antenna 10 in a manner well understood by those skilled in the art. A two-dimensional array of patch antenna radiating elements 32 is formed at an opposite side of the PCB structure 16 from the beamforming ICs 30 on a dielectric layer 34 and would combine to provide the phased array antenna 10, where the radiating elements 32 could be formed of ½ oz copper.

A modular heatsink insert 40 is coupled to the enclosure 12 by, for example, screws (not shown). The insert 40 includes a metal heatsink 42 and a number of heatsink pedestals 44, where a separate pedestal 44 is thermally coupled to one of the beamforming ICs 30 to draw heat away from the ICs 30. In this design, the heatsink 42 is a flat metal slab, however, other designs may be applicable. The insert 40 also includes propagation suppressing foam element 46, or other suitable material, positioned within gaps 48 between the beamforming ICs 30 to prevent RF resonant cavities from being created between the metal heatsink 42 and the printed feed network (not shown) of the antenna 10, such as microstrip, coplanar waveguide or some combination of common PCB transmission lines with grounding in the PCB structure 16. More particularly, the introduction of the metal heatsink 42 in proximity to the PCB structure 16 and RF transmission lines (not shown) can result in RF resonant cavities that are detrimental to the RF performance of the feed structure or the antenna radiating elements 32.

For this reason, the modular heatsink 42 is combined with the foam elements 46 that inhibits and/or suppresses RF propagation such that any cavities produced in the combination of the PCB/collective heat sink structure result in features that reduce the impact on the PCB structure 16 by attenuating any such propagation modes that would exist with air filled voids in the combined structure. A conductive paste could be used that provides both thermal coupling to the heatsink 42 from the PCB structure 16, and the suppression of propagating modes.

The modular heatsink insert 40 is intended to be a self-contained unit that can be removed from the enclosure 12 and coupled to other phased array antenna enclosures. Further, the insert 40 can be coupled to other phased array antenna enclosures operating at other frequency bands where the spacing between the beamforming ICs 30 would be different for that frequency band. The insert 40 would be slightly modified to change the position of the pedestals 44 to align with the beamforming ICs 30 and the size of the foam elements 46 to fit within the other size of the gaps 48. Thus, the tooling and design required for heatsinks for many mmWave phased array antenna designs can be reduced.

Figure 2:
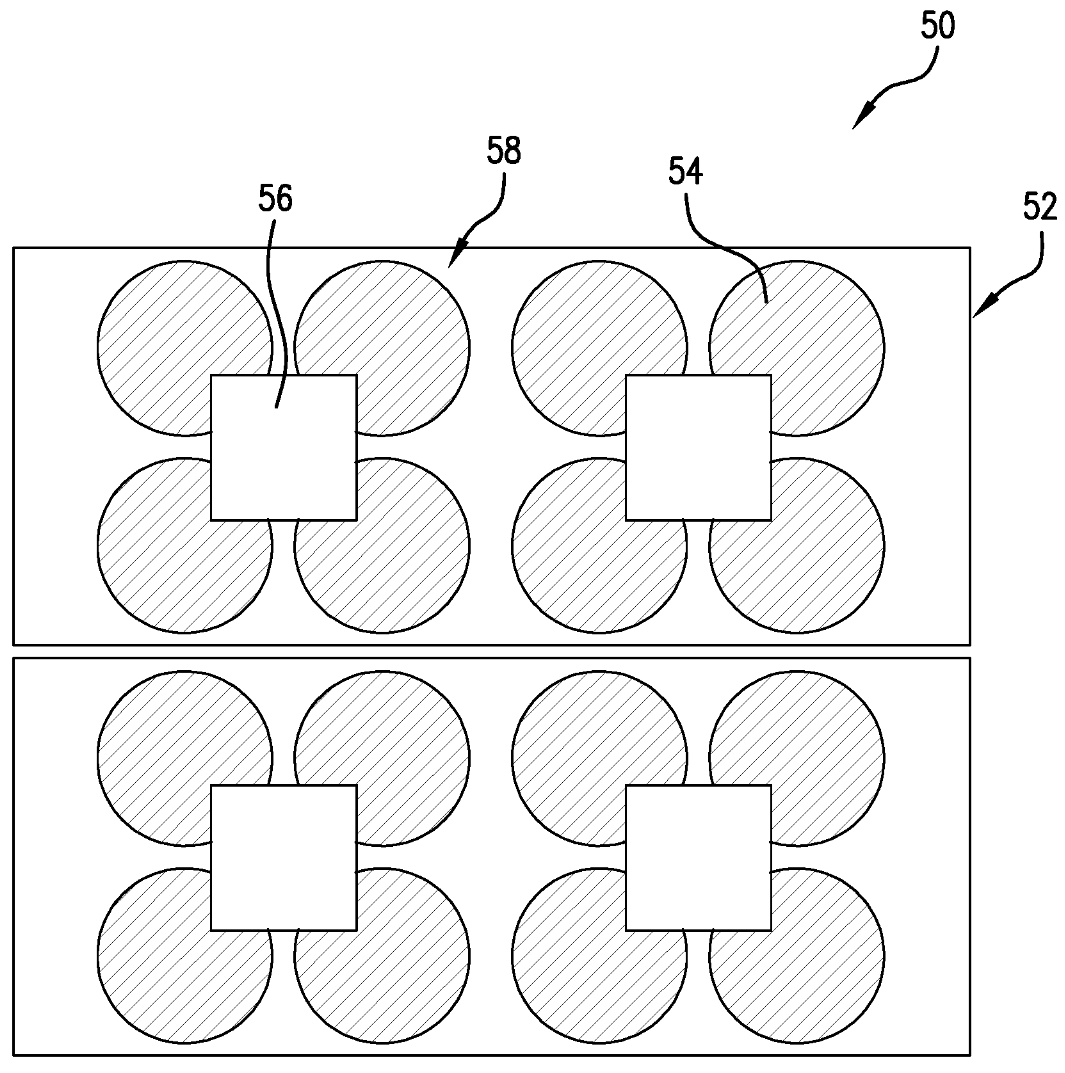
FIG. 2 is a top view of a mmWave phased array antenna including an array of patch antenna radiating elements and multiple modular heatsinks.

FIG. 2 is a top view of a mmWave phased array antenna 50 of the type discussed above where the PCB structure has been removed to illustrate the relationship and spacing between a modular heatsink unit 52 of the type discussed above, an array of patch antenna radiating elements 54 and beamforming ICs 56. Here, one antenna element 58 includes one beamforming IC 56 and four patch antenna radiating elements 54, where one modular heatsink unit 52 accommodates two antenna elements 58.

Figure 3:
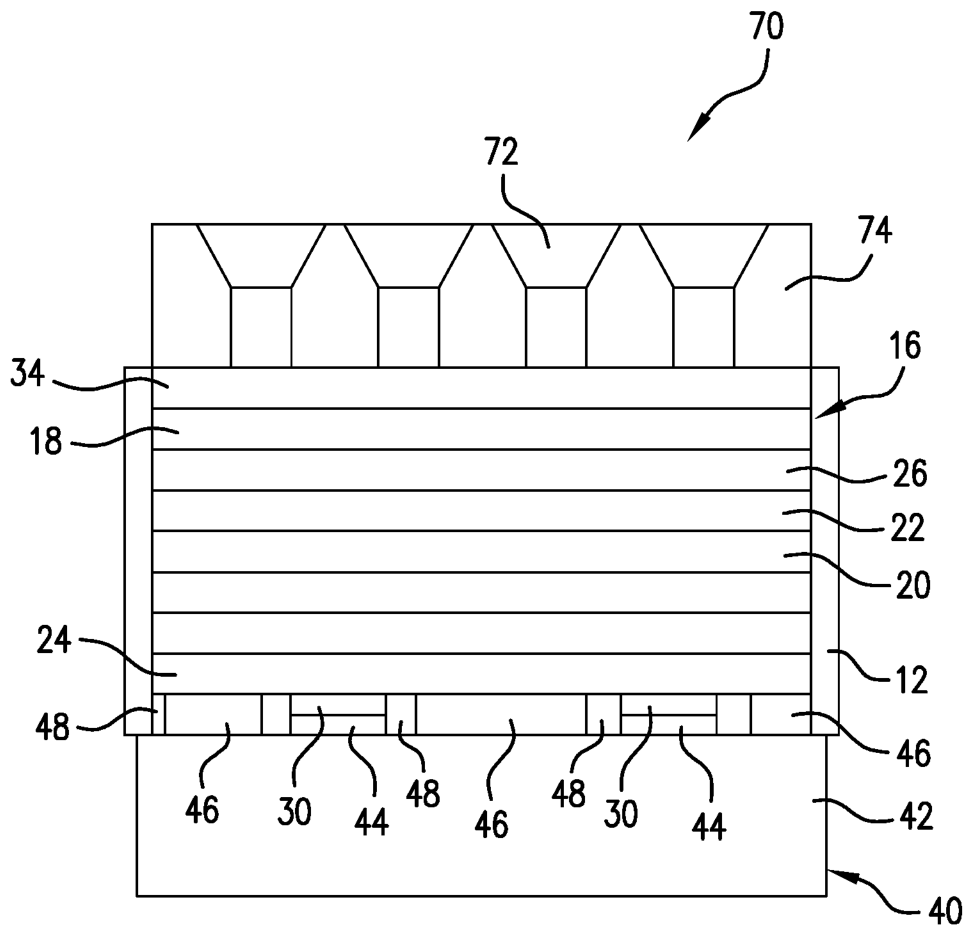
FIG. 3 is a profile view of a mmWave phased array antenna including an array of horn antenna radiating elements and a modular heatsink insert coupled to beamforming ICs.

In another embodiment, the patch antenna radiating elements are replaced with horn radiating elements. This embodiment is illustrated in FIG. 3 showing a mmWave phased array antenna 70 similar to the antenna 10, where like elements are identified by the same reference number. In this embodiment, the patch antenna radiating elements 32 are replaced with horn antenna radiating elements 72 formed in a metal layer 74.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. An antenna comprising:

an enclosure;

a printed circuit board (PCB) structure provided in the enclosure, said PCB structure including a plurality of layers having dielectric layers and conductive layers;

a plurality of radiating elements formed on one side of the PCB structure;

a plurality of beamforming integrated circuits (ICs) formed on an opposite side of the PCB structure from the radiating elements, where gaps are defined between the beamforming ICs; and a modular heatsink unit removably coupled to the enclosure, said heatsink unit including a heatsink and a plurality of pedestals thermally coupled thereto, where each pedestal is thermally coupled to one of the beamforming ICs.

2. The antenna according to claim 1 wherein the modular heatsink unit includes a plurality of propagation suppressing elements, where a separate propagation suppressing element is provided in each gap between the beamforming ICs.

3. The antenna according to claim 2 wherein the propagation suppressing elements are foam elements.

4. The antenna according to claim 1 wherein the heatsink is metal.

5. The antenna according to claim 4 wherein the heatsink is a flat slab.

6. The antenna according to claim 1 wherein the radiating elements are patch antenna radiating elements.

7. The antenna according to claim 1 wherein the radiating elements are horn antenna radiating elements.

8. The antenna according to claim 1 wherein the antenna is a phased array antenna.

9. The antenna according to claim 8 wherein the antenna is part of a 5G radio.

10. A phased array antenna comprising:

an enclosure;

a printed circuit board (PCB) structure provided in the enclosure, said PCB structure including a plurality of layers having dielectric layers and conductive layers;

a plurality of patch antenna radiating elements formed on one side of the PCB structure;

a plurality of beamforming integrated circuits (ICs) formed on an opposite side of the PCB structure from the radiating elements, where gaps are defined between the beamforming ICs; and a modular heatsink unit removably coupled to the enclosure, said heatsink unit including a heatsink, a plurality of pedestals thermally coupled thereto, where each pedestal is thermally coupled to one of the beamforming ICs, and a plurality of propagation suppressing elements, and where a separate propagation suppressing element is provided in each gap between the beamforming ICs.

11. The antenna according to claim 10 wherein the propagation suppressing elements are foam elements.

12. The antenna according to claim 10 wherein the heatsink is metal.

13. The antenna according to claim 10 wherein the heatsink is a flat slab.

14. The antenna according to claim 10 wherein the antenna is part of a 5G radio.

15. A phased array antenna comprising:

an enclosure;

a printed circuit board (PCB) structure provided in the enclosure, said PCB structure including a plurality of layers having dielectric layers and conductive layers;

a plurality of horn antenna radiating elements formed on one side of the PCB structure;

a plurality of beamforming integrated circuits (ICs) formed on an opposite side of the PCB structure from the radiating elements, where gaps are defined between the beamforming ICs; and a modular heatsink unit removably coupled to the enclosure, said heatsink unit including a heatsink, a plurality of pedestals thermally coupled thereto, where each pedestal is thermally coupled to one of the beamforming ICs, and a plurality of propagation suppressing elements, where a separate propagation suppressing element is provided in each gap between the beamforming ICs.

16. The antenna according to claim 15 wherein the propagation suppressing elements are foam elements.

17. The antenna according to claim 15 wherein the heatsink is metal.

18. The antenna according to claim 17 wherein the heatsink is a flat slab.

19. The antenna according to claim 15 wherein the antenna is part of a 5G radio.

* * * * *